United States Patent
Amatangelo et al.

(12) 
(10) Patent No.: US 6,654,937 B1
(45) Date of Patent: Nov. 25, 2003

(54) REGISTER FILE TIMING USING STATIC TIMING TOOLS

(75) Inventors: Matthew J. Amatangelo, Austin, TX (US); Christopher McCall Durham, Round Rock, TX (US); Peter Juergen Klim, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 611 days.

(21) Appl. No.: 09/637,324

(22) Filed: Aug. 10, 2000

(51) Int. Cl.[7] .............................................. G06F 17/50
(52) U.S. Cl. ......................................................... 716/6
(58) Field of Search ................................ 713/500, 503; 716/1, 2, 4–6, 8–14

(56) References Cited

U.S. PATENT DOCUMENTS 5,872,717 A * 2/1999 Yu et al. ........................ 716/6
5,966,521 A * 10/1999 Takeuchi et al. ............... 716/6
6,058,252 A * 5/2000 Noll et al. ..................... 716/10
6,522,989 B1 * 2/2003 Gover et al. ................. 702/126

* cited by examiner

Primary Examiner—Thomas M. Heckler
(74) Attorney, Agent, or Firm—Casimer K. Salys; Bracewell & Patterson, L.L.P.

(57) ABSTRACT

A method and apparatus is provided for enabling a static timing tool to analyze and test register files in integrated circuits to find correct paths and ignore detected contention. This is achieved by utilizing pattern matching in the static timing tool and having the tool perform certain operations on the transistors of the pattern matched. The methodology includes considering the write word lines as clock nodes, disabling signal propagation through the memory element components, forcing predetermined internal nodes to be of inverse polarity, establishing signal direction through the circuit elements, and indicating that one or more of the predetermined nodes are not to be reported.

18 Claims, 3 Drawing Sheets

_US 6,654,937 B1_

REGISTER FILE TIMING USING STATIC TIMING TOOLS

FIELD OF THE INVENTION

The present invention relates generally to integrated circuit design testing and more particularly to testing integrated circuits in complementary dual-rail systems using static timing tools.

BACKGROUND OF THE INVENTION

In designing integrated circuits (ICs), it is desired to be able to utilize efficient means in order to quantify and order every signal path within a design in terms of how long it takes the signal to propagate from its source to an end point and check that this propagation arrival against appropriate references is correct. Static timing software tools are used to accomplish that testing process. However, not every sort of design topology is able to be reconciled by the static timing tool. The present disclosure focuses upon the use of a static timing tool in testing topology that is pervasive in microprocessor and embedded designs including register files.

Previous approaches for simulating register files in static timers have primarily focused on building a model of the register file cell and simply avoid performing transistor analysis within it by enumerating desired input to output signal propagation and applying predetermined delay calculations. This competing approach requires that some other tool of circuit path analysis to be utilized in order to provide the delays through the register file. The motivation is to enable all possible paths to be found and ordered by delay or delay margin.

Thus there is a need to provide an improved method and apparatus to enable a static timing tool to determine the correct number of actual signal paths in a dual-rail system and report correct propagation delays in circuit where signal contention is detected.

SUMMARY OF THE INVENTION

A method and apparatus is provided for enabling a static timing tool to analyze and test register files in integrated circuits to find correct paths and ignore detected contention. This is achieved by utilizing pattern matching in the static timing tool and having the tool perform certain operations on the transistors of the pattern matched. The methodology includes disabling signal propagation through the memory element components, forcing predetermined internal nodes to be of inverse polarity, establishing signal direction through the circuit elements, and indicating that one or more of the predetermined nodes are not to be reported.

BRIEF DESCRIPTION OF THE DRAWINGS

A better understanding of the present invention can be obtained when the following detailed description of a preferred embodiment is considered in conjunction with the following drawings, in which.

DETAILED DESCRIPTION

Although the present disclosure shows isolated circuitry for the sake of simplicity, it is understood that the present invention is not limited to isolated implementations but rather also includes systems in which the methodology taught herein is implemented within or as part of a single system CPU or other larger semiconductor system, chip, processor or integrated circuit. Also, in the present example, the terms "source" or "source potential" or "VDD" are used interchangeably to refer to a logic "1" or "high" level potential. Also the terms "zero level", "ground potential", or "ground" are also used interchangeably to refer to a logic "0" or "low" level potential.

Figure 1:
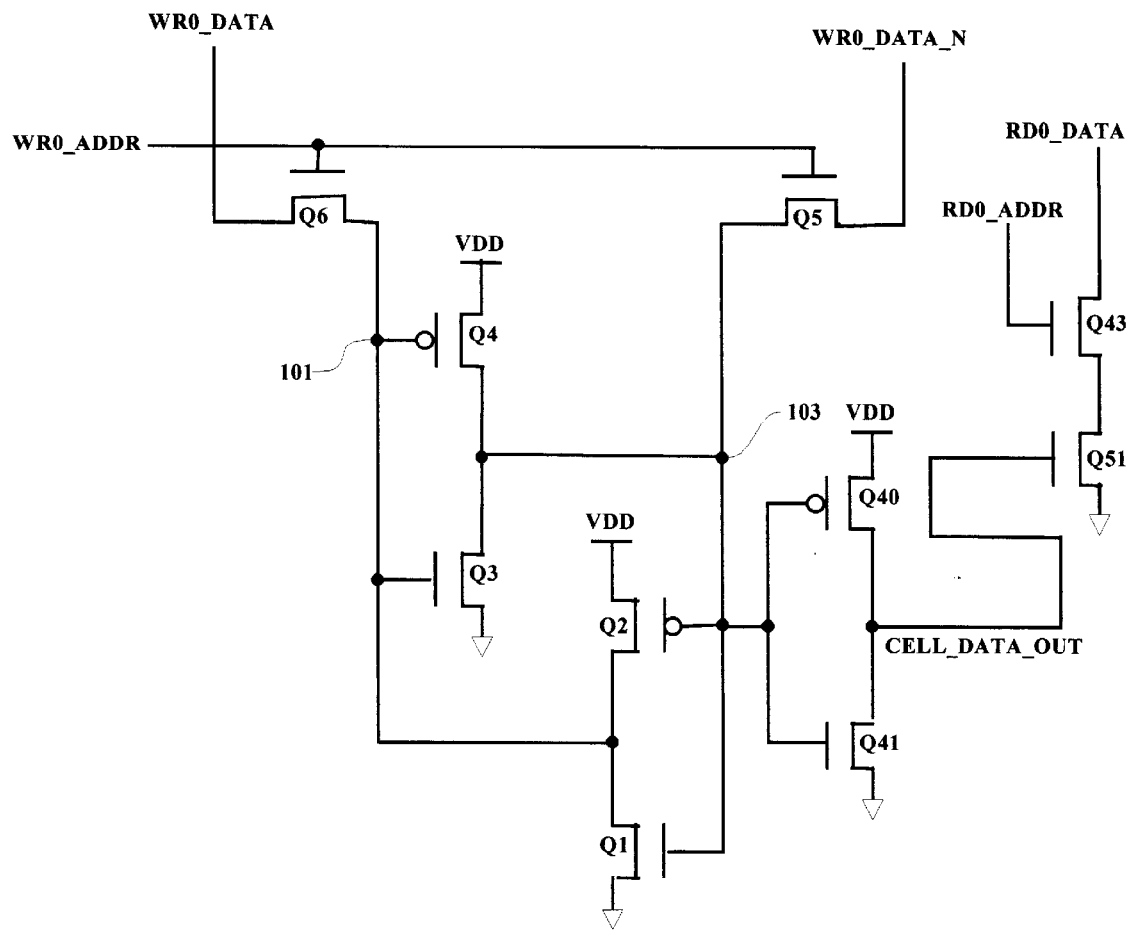
FIG. 1 is a schematic diagram of an exemplary register file cell.

A typical register file cell is illustrated in FIG. 1. The cell has been greatly simplified as to only show a single write and a single read port. Inclusion of several read and write ports in the schematic would only unnecessarily complicate the description of such cell, and it is understood that this disclosure applies to register files with any practical number of read and write ports.

The exemplary cell illustrated in FIG. 1 features dual rail data inputs, where WR0_DATA is the true value and WR0_DATA_N is the complement value. Write word line WR0_ADDR controls pass transistors Q5 and Q6. When WR0_ADDR is at VDD level (logic one), true and complement input data is passed to the internal cell nodes 101 and 103 respectively, regardless of the previous value stored in the cell. VDD represents the positive power supply rail. When the cell is not being written, WR0_ADDR remains at ground level (logic 0), input data is blocked by Q5 and Q6 and data previously stored is retained in the cell. The latching function for the storage cell is provided by first and second back-to-back inverters. The first inverter consists of transistors Q1 and Q2 and the second inverter consists of transistors Q3 and Q4. The gates of transistors Q1 and Q2 are connected to node 103 and the gates of transistors Q3 and Q4 are connected to node 101. The drain terminals of transistors Q1 and Q2 are both connected to node 101 and the drain terminals of transistors Q3 and Q4 are both connected to node 103. As in most register files, the output is single rail. In this example, a cell output inverter driver consists of Q40 and Q41. The gates of Q40 and Q41 are connected to node 103 and the drains of Q40 and Q41 are connected to CELL_DATA_OUT. The signal CELL_DATA_OUT drives the gate of-n-channel transistor Q51 and the drain terminal of transistor Q51 is connected to the source terminal of transistor Q43. Read word line RD0_ADDR is connected to the gate of Q43, and the drain terminal of transistor Q43 is connected to RD0_DATA which is dotted onto a dynamic OR structure as shown in FIG. 2.

Figure 2:
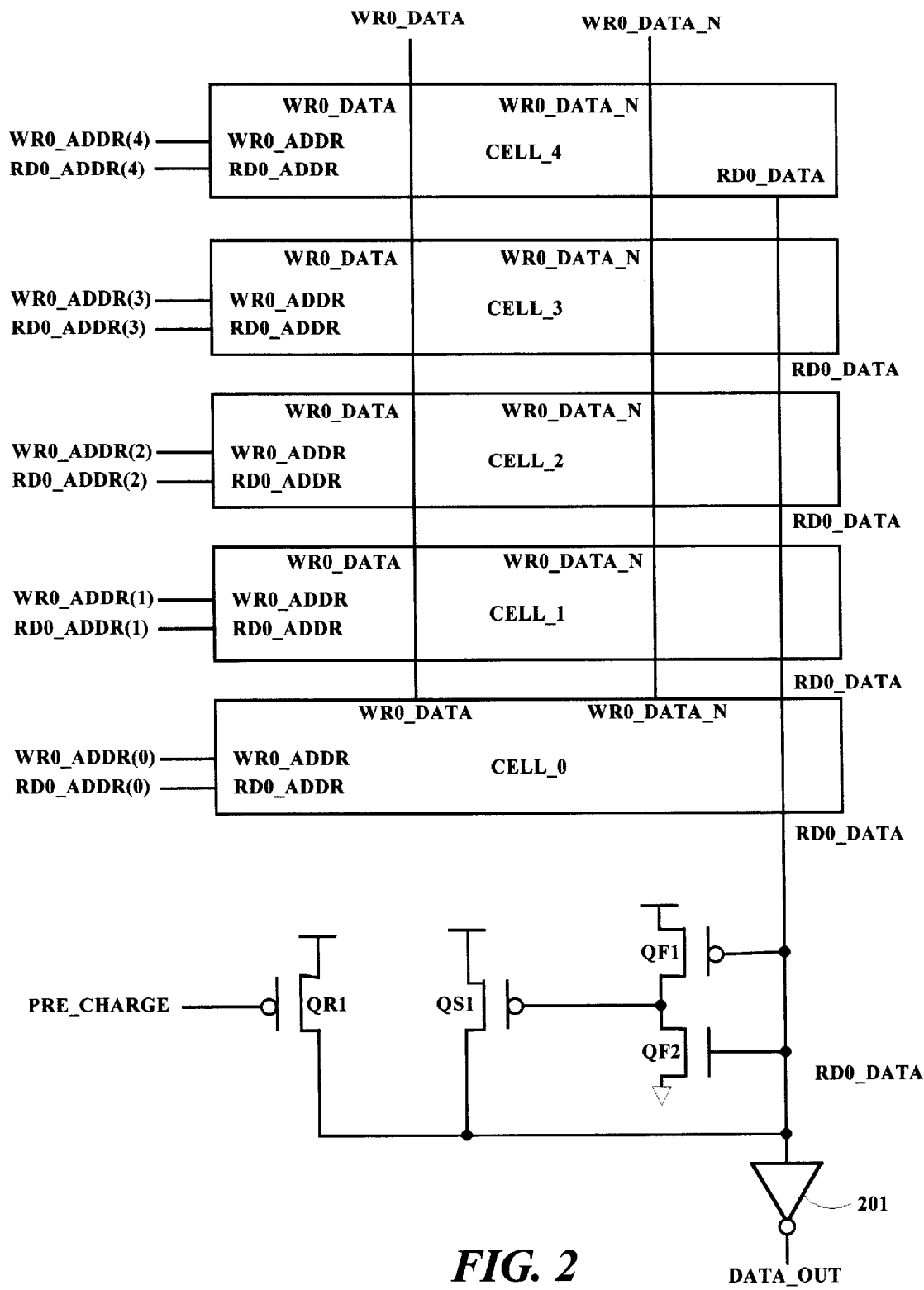
FIG. 2 is a schematic diagram illustrating an exemplary register file having five register file cells.

In FIG. 2, a simple register file having 5 entries (5 bits stacked vertically) and a width of 1 (1 bit horizontal) is depicted. It is understood that this disclosure includes register files with any practical number on entries and any practical width. Blocks CELL_0 through CELL_4 contain the cell structure discussed in FIG. 1 and the RD0_DATA word line is a dotted OR structure of all 5 entries. P-channel transistor QR1 is driven by the PRE_CHARGE input. When PRE_CHARGE is a logic 0, RD0_DATA is precharged to VDD and DATA_OUT goes to a logic 0 via inverter 201. There is also shown a p-channel "keeper" device QS1 which has its gate tied to drains of the inverter consisting of QF1 and QF2. During pre-charge as RD0_DATA goes high QF2 turns on, which then turns on QS1. As PRE_CHARGE goes high (standby phase) RD0_DATA is kept at a logic 1 by QS1. This is necessary as junction and sub-threshold leakage would bleed off the charge deposited at the PRE_CHARGE node over time. Evaluation starts when one and only one of the RD0ADDR(0) through RD0ADDR(4) goes high.

Referring again to FIG. 1, assuming a 0 was previously written into the cell, node 101 is low and node 103 is high. It follows that CELL_DATA_OUT is low. Then n-channel device Q51 is off and no path to ground would exist. Hence RD0_DATA retains its pre-charge level (logic 1) and DATA_OUT (FIG. 1) remains low. If instead a 1 were present in the cell accessed, node 101 is high, node 103 is low, CELL_DATA_OUT is high and Q51 is on. The PRE_CHARGE node is now pulled to ground level when Q43 is turned on by RD0_ADDR. The output DATA_OUT now goes high while p-channel device QF1 turns on, shutting off keeper device QS1. For the purpose simplification of the discussion, read and write address decoders were not included in the circuit diagrams although it is understood that the invention is applicable for register files with read and write addresses decoders as well.

The circuit action inherent in register files which is difficult for static timers to analyze is the differential writing of the cell, i.e. when true and complement data is passed through to the memory element which stores the logic state. Static timers seek to isolate one path at a time between one signal source and its end point to analyze for providing propagation delay. These tools will eventually analyze all paths, but only one at a time. And in the case of register files, where the data being input to the memory element is split to differentially update the element, only one of the two paths are simulated at a time and any positive effects of the parallel path are missed. Additionally, the parallel path will also be timed and, because the memory element is symmetrical, this path will not appear to have the same end point as its complementary path. So, two paths are reported, with wrong delays, where only one path exists. From FIG. 1, an example real path of data falling to WR0_DATA, and WR0_DATA_N rising, cause node 103 to rise and node 101 to fall, would be assessed by the static timer as two paths: (1) WR0_DATA rising causing node 101 to fall, and then node 103 to rise and then CELL_DATA_OUT to fall; and (2) WR0_DATA rising to node 103 rising and CELL_DATA_OUT falling. The delays will be wrong because the static timer will detect the presence of signal contention when trying to write the memory element, i.e. for path 1, while node 101 is falling, node 103 still has the initial condition of being a logic level 0 and hence Q2 will try to force the logic level 1 onto node 101. In reality this signal contention may exist but only for a brief moment because 103 will not remain at the 0 logic state as the logic level 1 from WR0_DATA_N passes through Q5.

The invention solves the problem of reporting too many paths by (1) disabling propagation through the memory element (from FIG. 1, Q1, Q2, Q3, Q4), (2) indicating to the timing tool that no timing analysis is to be done to the node 101, and (3) guiding the signal propagation through the pass gates (signal propagates through Q5 and Q6 to 103 and 101, respectively). The problem of bad delay calculations is addressed by (1) indicating to the timing tool that certain signal pairs are always opposite in polarity (from FIG. 1, 101 and 103 have opposite polarity as well as WR0_DATA and WR0_DATA_n and (2) disabling any paths between drain and source of the memory cell transistors onto 103 (from FIG. 1, Q1, Q2, Q3, Q4).

The present invention enables the static timer to perform the necessary transistor action for path analysis and reporting without either utilizing another tool or providing a contrived bridging between pairs of circuit nodes. An additional benefit of our new method is that the static timing tool may be utilized as a true simulation tool for all relevant paths.

Figure 3:
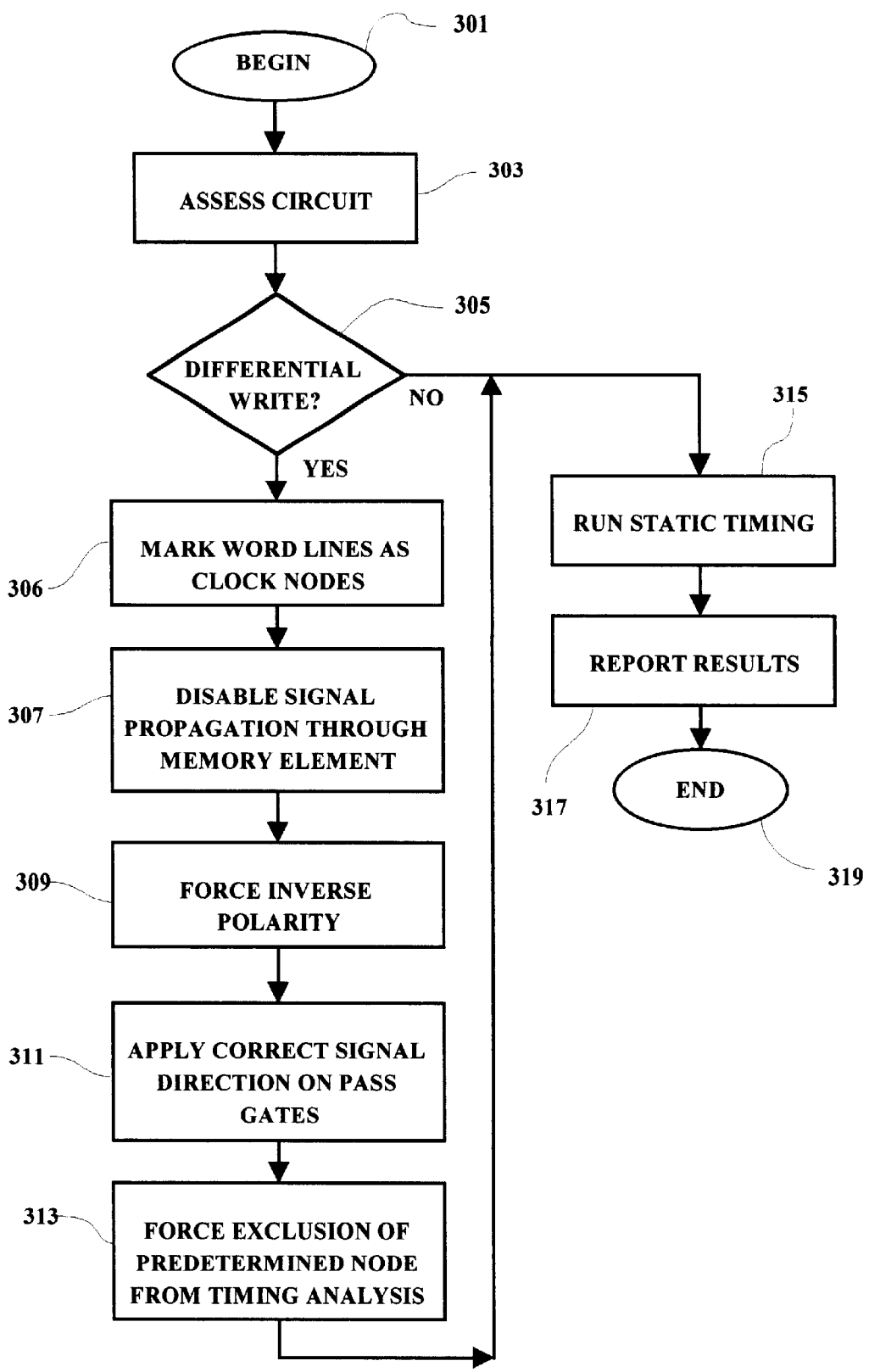
FIG. 3 is a flow chart illustrating an exemplary methodology which may be implemented in practicing the present invention.

An exemplary methodology for an implementation of the present invention is illustrated in flow chart form in FIG. 3. As shown in FIG. 3, the methodology begins 301 when the circuit to be analyzed is assessed 303 to determine if the circuit requires differential write operations. If so 305, the storage node is identified and the write word lines are devised to be clock nodes 306 which are used to enable and disable the capturing of data from the input. Then, in the example, signal propagation is disabled 307 through the cross-coupled devices of the memory element of the circuit. This is done by, for example, blocking all paths (i.e. disabling timing analysis of any delay path that includes these devices) that would pass through the gate inputs of the transistors making up the memory element. Next, the complementary nodes are forced to have inverse polarity 309. Thus, in the example, nodes 101 and WR0_DATA are forced to have inverse polarity from corresponding nodes 103 and node WR0_DATA_N, respectively. Next, correct signal direction is applied 311 to the pass gates to assure that delay paths propagate from input ports to the storage node, and then directly through the output. For example, Q5's signal propagates from WR0_DATA_N to node 103. The next step in the exemplary methodology is to force exclusion of a predetermined node from all paths being analyzed. This is done to exclude redundant paths. The primary path of data propagation is normally the more direct one, although circuit analysis is necessary to confirm this. For example, node 103 is a latch node that includes both paths WR0_DATA_N to RD0_DATA, and WR0_DATA to RD0_DATA. Node 101 is also a latch node but is farther from the output. In the example, node 101 is excluded 313. Following the node exclusion 313, the static timing analysis is run 315 on the circuit being analyzed. In the event the circuit under analysis is determined not to be a differential circuit in step 305, the static timing analysis is run 315 directly after that determination is made in step 305. After the static timing analysis is run 315, the results are reported 317 and the processing ends 319. Steps 307 through 313 need not be accomplished in the sequence presented in the exemplary embodiment, and may be implemented in any convenient sequence in order to gain the benefits of the present invention.

The method and apparatus of the present invention has been described in connection with a preferred embodiment as disclosed herein. Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

What is claimed is:

1. A method for performing static timing analysis on a memory circuit having a differential input, said method comprising:
   determining that said memory circuit requires a differential input; and
   excluding redundant paths within said memory circuit from said static timing analysis.

2. The method as set forth in claim 1 wherein said memory circuit includes a dual-rail input system.

3. The method as set forth in claim 1 wherein said memory circuit comprises a plurality of memory cells.

4. The method as set forth in claim 3 wherein said memory cells comprise register file cells.

5. The method as set forth in claim 1 and further including:
- marking write word lines of said memory circuit;
- using said write word lines to control capturing of data input to said memory circuit;
- disabling signal propagation through said memory circuit;
- forcing inverse polarity on complementary nodes within said memory circuit;
- applying appropriate signal direction on pass gates within said memory circuit; and
- excluding one or more nodes of said memory circuit not to be reported in said static timing analysis.

6. The method as set forth in claim 5 and further including performing said static timing analysis after said excluding of said one or more nodes.

7. The method as set forth in claim 5 wherein said memory circuit includes a dual-rail input system.

8. The method as set forth in claim 5 wherein said memory circuit comprises a plurality of memory cells.

9. The method as set forth in claim 8 wherein said memory cells comprise register file cells.

10. A storage medium including machine readable coded indicia, said storage medium being selectively coupled to a reading device, said reading device being selectively operable to read said machine readable coded indicia and provide program signals for performing static timing analysis on a memory circuit having a differential input, said program signals being operable for:
- determining that said memory circuit requires a differential input; and
- excluding redundant paths within said memory circuit from said static timing analysis.

11. The storage medium as set forth in claim 10 wherein said memory circuit includes a dual-rail input system.

12. The storage medium as set forth in claim 10 wherein said memory circuit comprises a plurality of memory cells.

13. The storage medium as set forth in claim 12 wherein said memory cells comprise register file cells.

14. The storage medium as set forth in claim 10 wherein said program signals are further operable for:
- marking write word lines of said memory circuit;
- using said write word lines to control capturing of data input to said memory circuit;
- disabling signal propagation through said memory circuit;
- forcing inverse polarity on complementary nodes within said memory circuit;
- applying appropriate signal direction on pass gates within said memory circuit; and
- excluding one or more nodes of said memory circuit not to be reported in said static timing analysis.

15. The storage medium as set forth in claim 14 wherein said program signals are further operable for effecting an execution of said static timing analysis after said excluding of said one or more nodes.

16. The storage medium as set forth in claim 14 wherein said memory circuit includes a dual-rail input system.

17. The storage medium as set forth in claim 14 wherein said memory circuit comprises a plurality of memory cells.

18. The storage medium as set forth in claim 17 wherein said memory cells comprise register file cells.

* * * * *